United States Patent
Sweet et al.

(10) Patent No.: US 6,854,566 B2
(45) Date of Patent: Feb. 15, 2005

(54) CONTACTLESS PUSH BUTTON SWITCH COMPRISING A HALL EFFECT TRANSDUCER AND MICROPROCESSOR

(75) Inventors: Robert H. Sweet, Lakeside, CA (US); James A. Nickerson, Santee, CA (US); Michael A. Palazzola, San Diego, CA (US)

(73) Assignee: Thyssenkrupp Elevator Capital Corp., El Cajon, CA (US)

(*) Notice: Subject to any disclaimer, the term of this patent is extended or adjusted under 35 U.S.C. 154(b) by 3 days.

(21) Appl. No.: 10/615,430

(22) Filed: Jul. 7, 2003

(65) Prior Publication Data

US 2004/0104080 A1 Jun. 3, 2004

Related U.S. Application Data

(63) Continuation of application No. 09/865,269, filed on May 25, 2001, now Pat. No. 6,612,404.

(51) Int. Cl.[7] ................................................. B66B 3/00
(52) U.S. Cl. ................................. 187/395; 335/207
(58) Field of Search .............................. 187/391–396, 187/385, 397, 388, 389, 414; 307/112; 335/205, 207; 338/128, 332, 32 H

(56) References Cited

U.S. PATENT DOCUMENTS

| | | | | |
|---|---|---|---|---|
| 3,882,337 A | * | 5/1975 | Pfeffer et al. ............... | 310/273 |
| 4,054,860 A | * | 10/1977 | Henderson et al. ........ | 338/32 H |
| 4,061,988 A | * | 12/1977 | Lewandowski ............ | 338/32 H |
| 4,230,206 A | * | 10/1980 | Brooks ........................ | 187/395 |
| 4,311,981 A | | 1/1982 | Luzynski ................... | 338/32 H |
| 4,489,303 A | * | 12/1984 | Martin ........................ | 338/128 |
| 5,272,383 A | * | 12/1993 | Umemura et al. .......... | 307/112 |
| 5,581,179 A | | 12/1996 | Engel et al. ............. | 324/207.2 |
| 5,608,317 A | | 3/1997 | Hollmann ................ | 324/207.2 |
| 5,679,934 A | * | 10/1997 | Juntunen et al. ............ | 187/395 |
| 5,781,005 A | | 7/1998 | Vig et al. ................ | 324/207.2 |
| 5,914,466 A | * | 6/1999 | Durand ....................... | 187/395 |
| 6,097,272 A | * | 8/2000 | Grover et al. ............. | 335/207 |
| 6,161,655 A | * | 12/2000 | Lejon et al. ................ | 187/392 |
| 6,612,404 B2 | * | 9/2003 | Sweet et al. ................ | 187/395 |

FOREIGN PATENT DOCUMENTS

EP            367692       5/1990

* cited by examiner

Primary Examiner—Jonathan Salata
(74) Attorney, Agent, or Firm—Frost Brown Todd LLC

(57) ABSTRACT

A programmable switching device that employs a Hall Effect sensor and a moving magnet is disclosed. The Hall Effect sensor is electrically connected to a programmable microprocessor that is programmed to detect changes in Hall Effect voltages at the sensor. The programmable switching device may also be configured as a rotary switching device. By using a plurality of magnets and Hall Effect transducers and orienting some magnets with their polarities in different directions, a temper-proof switch can be achieved. The programmable switching device may be connected to a serial bus that is interfaced with an elevator controller.

11 Claims, 3 Drawing Sheets

CONTACTLESS PUSH BUTTON SWITCH COMPRISING A HALL EFFECT TRANSDUCER AND MICROPROCESSOR

This application is a continuation of U.S. patent application Ser. No. 09/865,269, filed May 25, 2001 now U.S. Pat. No. 6,612,404, the contents of which are incorporated herein by reference in their entirely.

1. Field of Invention

The present invention relates to switching devices. In particular, the present invention provides a programmable contactless switching device that is particularly well suited for use in elevator systems.

2. Description of Related Art

Push-button switches and rotary lever operated switches are common in many different systems. For example, elevator systems employ numerous push-button switches, as well as rotary, key operated switches. Typically, each elevator landing area employs hall call push-buttons. Each elevator car also employs a plurality of push-buttons for allowing passengers to select those floors at which the car should stop and key operated rotary switches for use by elevator service personnel and fire departments. Both the push-buttons and the rotary switches in the prior art employ mechanical contacts. For example, conventional push-buttons typically use standard mechanically operated micro-switches, having mechanical electrical contacts. Usually, the push-buttons contain one or more fixed contacts and a movable conducting bridge that moves as the push button moves, so that when the push button is depressed, the bridge electrically connects or disconnects the fixed contacts to form a closed or opened electrical circuit. Electrical wires connect the push-buttons and the rotary switches to an elevator controller. By opening or closing an electrical circuit, the switches generate signals that can be interpreted by the controller. One shortcoming of these mechanical contact switches is that, over time, the contacts and moving bridge elements wear and can malfunction. For example, push-buttons often get stuck in a closed or opened position and there is no reliable method for determining when a push-button switch needs maintenance.

SUMMARY OF THE INVENTION

The present invention provides contactless programmable switching devices. These devices are particularly well-suited for use in elevator systems but may be used in other application that require switching devices. A programmable push-button device according to the present invention comprises a push-button element having an outer surface that an elevator passenger can press with a finger. The push-button element is linearly displaceable between at least a first and second position and is biased toward the first position so that when displaced to the second position it returns to the first position. A magnet is mounted on push-button element. A Hall Effect transducer is located in line with the linear displacement direction of the push-button element. The Hall Effect transducer is located such that when the push-button element is depressed, the magnet moves closer to (or farther away) from the transducer. The Hall Effect transducer is connected to a programmable microprocessor. The microprocessor is capable of being programmed with a unique address. A communication interface for linking the microprocessor to a central computer, such as for example an elevator controller, is connected to the microprocessor.

The present invention may also be employed in a rotary switch. In one embodiment, a plurality of magnets are mounted on a rotatable disk with at least two having their polarities oriented in different directions. A plurality of Hall Effect transducers are located on a surface parallel to the disk. When the rotatable disk is in a first position a first set of the magnets is adjacent to the Hall Effect transducers. As the disk rotates, a second set of magnets, some of which have their polarities oriented differently than those in the first set, becomes aligned over the Hall Effect transducers. The transducers are connected to a microprocessor that can detect changes in the Hall Effect voltages in the transducers. In this embodiment, the switch cannot be activated by placing an external magnet near the device.

DETAILED DESCRIPTION OF THE INVENTION

Figure 1:
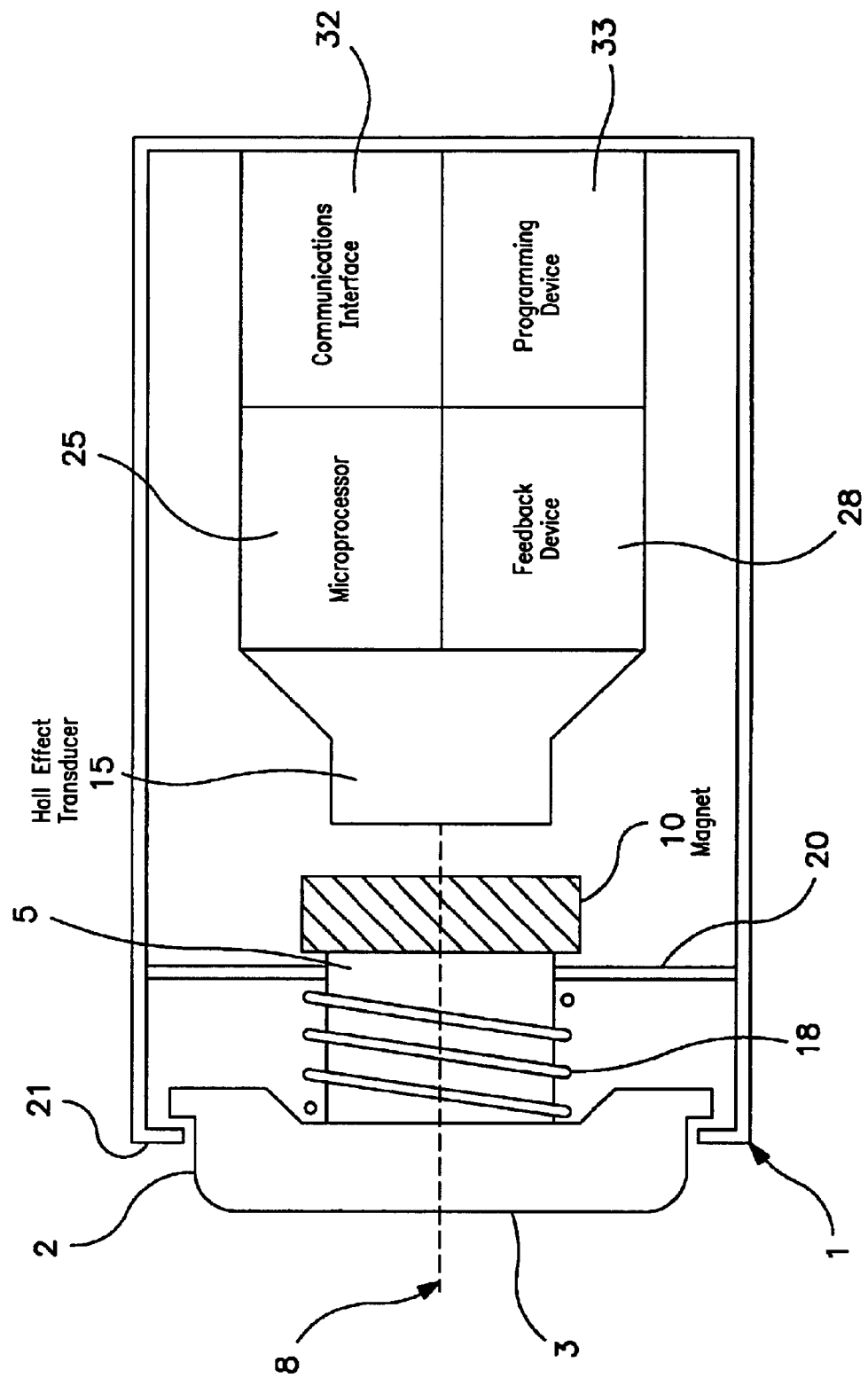
FIG. 1 shows a programmable elevator push-button according to the present invention.

As is shown in FIG. 1, a contactless programmable push-button 1 comprises a push-button element 2. The push-button element 2 has an exterior surface 3 and an interior mounting surface 5. The push-button element 2 is linearly displaceable along a line 8 between a first and second position. The mechanical structure of the button and the relative locations of the first and second positions may vary through the use of conventional parts such as springs 18 and tabs 20 and 21. A magnet 10 is mounted to the interior surface 5. A Hall Effect transducer 15, such as OPTEK® Model OHS3150U (available from OPTEK, Inc. 1215 Crosby Rd, Carolton Tx, 75006), is mounted in line with the linear displacement direction of the push-button element, i.e. the transducer is mounted along the line 8. The spring 18 biases the push-button element 2 toward the first position. When the push-button element 2 is depressed, the magnet 10 moves closer toward the Hall Effect transducer 15. As the magnet 10 moves toward the Hall Effect transducer 15, the Hall Effect voltage in the transducer 15 changes and when the magnet 10 moves back toward the first position the Hall Effect voltage changes back to its original state. This change in Hall Effect voltage is communicated to a microprocessor 25 (such as the Microchip® 12C671, available from Microchip Tech., Inc. 2355 West Chandler Blvd, Chandler Az 85224) that is interfaced with the Hall Effect transducer 15. In the event that the push-button element 2 sticks in the second position, the microprocessor 25 can sense not only that the Hall Effect voltage increased when the push-button element 2 moves from the first position to the second position, but also that the Hall Effect voltage did not change back to its initial value, thus indicating that the push-button element 2 stuck in the second position. If a passenger frees the push-button element 2, a change in Hall Effect voltage will occur as a result of the magnet's change in displacement, and this can be detected by the microprocessor 25. Moreover, even if partial movement of the push-button element 2 is restricted or other damage or wear has occurred, a change in Hall Effect voltage will still occur. This change will be detected and processed by the microprocessor 25 and in some embodiments, less than optimal performance will be noted by the microprocessor 25.

The microprocessor 25 is configured to determine when the push-button element 2 is depressed. A button press is defined as a step change in the magnetic field measured over a brief period of time. The period of time and the size of the step change are parameters that may be programmed. Thus, these parameter can be optimized for each application of a given push-button device.

The microprocessor 25 preferably has a One Time Programmable ("OTP") memory. The sequence of operations that the microprocessor 25 is programmed to perform are stored in a memory. During initial program development, it may be advantageous to use devices with Erasable Programmable Read Only Memory ("EPROM"). Software can be tested and the memory can be erased and reprogrammed to allow for changes that typically become necessary during software development. Typically, EPROM devices may be erased by exposing them to Ultraviolet ("UV") radiation. To accommodate exposure to UV radiation, many erasable devices contain quartz windows through which the UV radiation may pass. These "windowed" devices are relatively expensive, as a ceramic case is required to bond the quartz window. Once the software has been developed and fully tested, a less expensive microprocessor—one not having a window—may be used. The microprocessor 25 preferably does not contain a window to permit UV radiation to erase the memory; hence it is a OTP memory device.

The microprocessor 25 may be programmed to read operational parameters from tables at predefined locations within the OTP. The microprocessor 25 may be externally programmed via a programming device 33. The programming device 33 may be an integral part of the push-button 1 or may be externally connected to the push-button 1. The OTP memory of the microprocessor 25 may be reprogrammed a limited number of times and is not, therefore, only programmable once. For example, if the sample rate is a number from 1 to 255 and is stored as a byte in a table beginning at memory address 106 and the program is told the table of entries is 20 entries long, the initial value is programmed at location 106 and the remainder of the table from 107 to 125 is left in the erased state, having all ones. At a later point in time, the device may be reprogrammed to change the sample rate stored at location 106 to 0 and a new sample rate stored at location 107. The software would use the first non 0 value found in the table starting at 106 and continuing through 125. This would permit reusing the device 20 times with different sample rates, even though an OTP memory microprocessor is used.

Preferably, but not necessarily, the microprocessor 25 is capable of being programmed after it is soldered to a circuit board. This allows for the manufacturing of generic push-button devices that can later be programmed for specific uses. The microprocessor 25 should also allow for the changing of some or all parameters after initial programming. For example, the rate at which the microprocessor 25 looks at the Hall Effect transducer 15 to determine the magnet position may be increased or decreased to handle short or slow button presses more efficiently. This scan rate can be read from a table stored in the microprocessor's program space. The program memory starts out with all bits programmed as a 1. When the device is programmed, the 1 bits are changed to 0. To change the scan rate, the memory location currently in use is programmed to all 0's and the next location is programmed to the new value. The microprocessor continues to read until a non 0 value is returned. The non 0 value is then used to determine the new scan rate.

The microprocessor 25 may use an averaging algorithm to compensate for changes in quiescent Hall Voltage readings that result from inexact placement of the magnet 10 and/or Hall Effect transducer 15; variations in magnet field strength, which result from, among other things, variations in the magnet manufacturing process; and other environmental changes, such as changing temperature. The averaging algorithm may be a running averages algorithm. At each start up, a new average is accumulated for the transducer. The average is used as a start-up quiescent value. As time goes on, a running average is maintained, and the running average is used to update the quiescent value.

The running averaging algorithm may operate as follows. The running average is set to zero each time the processor starts. The Hall Effect voltage is averaged over a pre-selected minimum number of samples. Eight samples is usually satisfactory, but the minimum number of samples may be higher or lower. If the minimum number of samples needed to generate an average is 8, the average will not be valid until the first eight samples are collected. As a ninth sample is collected, the running average is reduced by one eighth, and one eighth of the ninth sample is added to the running average. As a tenth sample is collected, the running average is reduced by one eighth, and one eighth of the tenth sample is added to the running average. This process continues so long as the microprocessor 25 is running. The running average will reflect slow changes in the value caused by environmental factors. This running average will be used as the quiescent value and will be compared to a current transducer reading to watch for a step change from the running average. A step change, will signal a button push. If the button is jammed into a position part-way through the range of travel, the running average will take on a new value and still be able to detect a button push when a step change from this new running average occurs. For example, if a vandal jambs a button in a depressed position, the running average will be updated and the partially depressed position will become the new quiescent state. If there is any button travel remaining, subsequent button pushes will be reported normally. The button may also report reduced functionality to the controller so as to indicate when maintenance is needed.

The microprocessor 25 may also be interfaced with a communications interface 32 and a feedback device 28 that provides feedback to the button operator. The feedback device 28 might take the form of LEDs that illuminate or might produce an audio signal. The feedback device 28 can either be incorporated into the button of the present invention or may be an external device.

Figure 2:
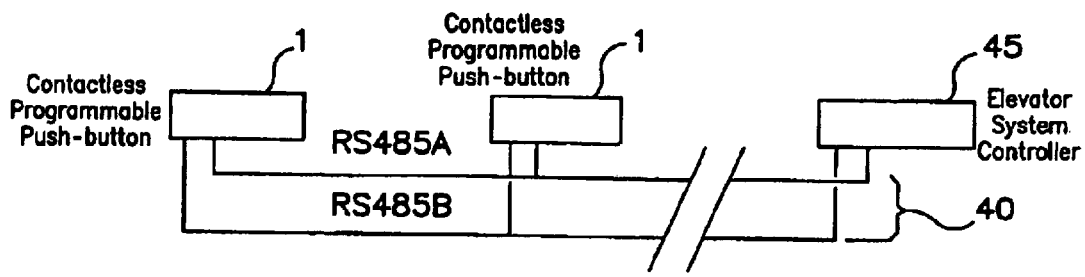
FIG. 2 illustrates a plurality of programmable contactless buttons interfaced with an elevator controller.

As is shown in FIG. 2, a two wire RS485 bus 40 (which could be a LIN, CAN, or other multidrop bus configuration) connects a plurality of push-buttons 1 according to the invention to an elevator system controller 45, which may be a computer or other device capable of executing one or more instructions. The push-button devices 1 are connected in parallel to the same wires and report a change in state via a serial communications. The push-buttons 1 are polled by the controller 45 at regular intervals and respond only when addressed.

Figure 3:
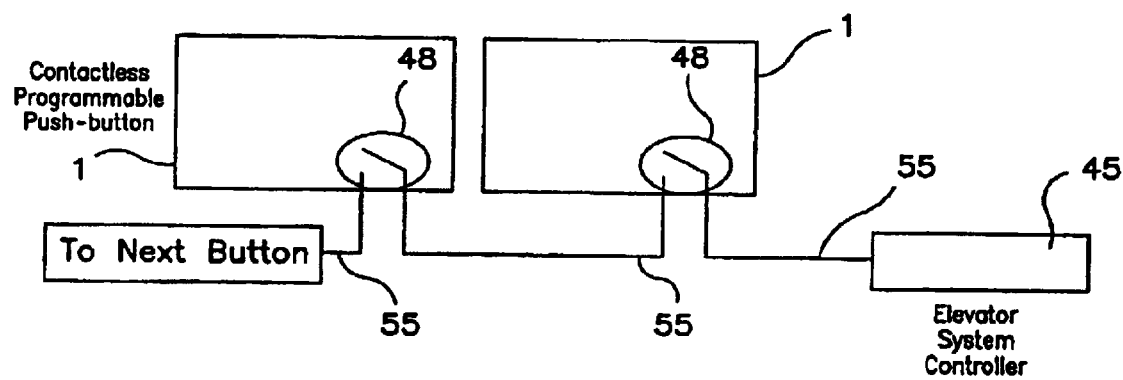
FIG. 3 illustrates an alternative embodiment of the present invention wherein an elevator controller assigns addresses to a plurality of programmable buttons in an elevator system.

The button 1 of the present invention may be programmed with a unique identification, or, alternatively, the system may assign unique identification to each push-button 1 in the system. As is shown in FIG. 3, an address wire 55 may be used to connect each push-button 1 to the controller 45. The address wire 55 runs from the controller 45 in and out of each push-button 1 in order from the first to last. The address wire 55 is interrupted at each push-button 1 with an address switch 48 that is controlled by each button's microprocessor. As a group of push-buttons is powered up, the address switch 48 in each push button 1 (or within the microprocessor circuit of each button) defaults to an open condition. Thus, only the first push-button, i.e. the push-button nearest the controller 45, will sense a signal from the controller 45. The first push-button takes the first address presented by the controller 45. The first push-button closes the address switch 48 and the second push-button then senses a signal. The controller 45 presents the next address to the second push-button. The process continues until no more push-buttons respond to the controller 45.

One advantage of having the system automatically assign unique addresses is that each push-button may be manufactured as an identical device and switches in an elevator system may be readily replaced with new components. The new push-buttons would not need to be reprogrammed prior to installation. After new push-buttons are installed in an elevator system, the system may be powered up or a reset command sent by the controller. The push-buttons wait for a command to assign them their unique addresses. The address switch in each push-button defaults to open on power-up or upon receiving the reset command. This breaks the address wire connection from one push-button to the next on the address wire. As all of the push-buttons are in a reset state, they will respond to directed commands if the incoming address wire is high. Thus, if the incoming address wire is high and a push-button is in a reset state and the command is an address command, then that push-button will be assigned the address in the address command. After that push-button receives its address, the address switch closes and the next push-button is ready to receive its address. The controller can thus assign unique addresses to all devices on the bus in order along the address wire. This feature allows the system to recover when a device is replaced or a power on or reset sequence is executed.

Figure 4:
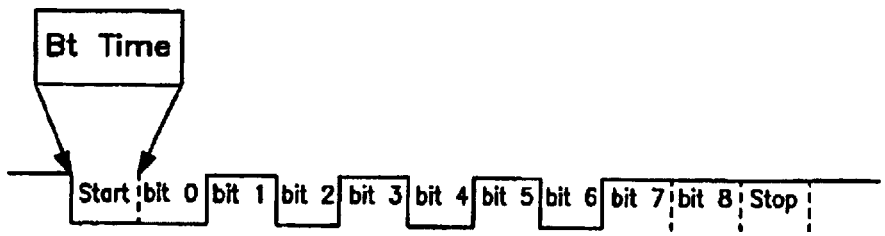
FIG. 4 graphically illustrates a packet of information that may be transmitted to or from a programmable button.

Communication on the bus 40 may take the form as shown in FIG. 4. Each device on the bus 40 is operating on a time base. There does not need to be synchronization between the devices. When one device changes state, the other devices on the bus 40 detect the change. The change is detected by sampling the bus 40 at periodic intervals. Bit Time ("Bt") is the time each bit will be present on the bus. It is dependent on the number of devices in the system and on how often they must be polled. As is shown in FIG. 4, bits 8, 7, 5, 3 and 1 represent a high state and bits 0, 2, 4 and 6 represent low states. The default or resting state is a high state. Communications occur by sending a packet comprising a start bit, data bits, and a stop bit. Each bit is present for one Bt time. Each packet begins with a start bit, which is always a low bit. Eight data bits follow starting bit 0 and end with bit 7 (the complete byte). An address/command byte is identified by a high bit 8. A data byte is identified by a low bit 8. The 9 bits are followed by a Stop bit, which is always a high bit. The Start bit and Stop bit frame the packet. The elevator controller samples the communication bus, preferably at least three times as fast as the Bt time.

Transmission of packets along the bus may occur as follows: A transmitting device on the bus raises the bus to a high state for one bit or lowers the bus to a zero state for a zero bit, for one Bt time period. A receiving device samples the bus three times during each Bt time period. The receiving device watches for the first transition on the bus from a one to a zero, which marks the leading edge of a Start bit. Once the edge of the Start bit is located, the receiving device remembers this, and, if at the next sample, the bus is still a low state, the receiving device assumes that the transmitting device is in the middle of sending a Start bit. Three samples later, the value detected by the receiving device will be the value of the 0 bit. The value detected another three samples later, is the value of bit 1, and so on until the Stop bit is reached. If the Stop bit value is not a one, the packet will be discarded and the receiving device will wait until the bus is in the high state for two Bt times (6 samples in this embodiment) and the process for detecting a Start bit will be repeated.

A Start bit is considered valid if it is detected at two subsequent sample times. Once it is determined that the Start bit is valid, collection of data bits may commence. Subsequent data bits are sampled a Bt time after a valid Start bit is detected. Sampling preferably occurs as near the center of the Bt time as practical. After the controller 45 sends data to a button, the controller 45 waits for some time for a response. The response time will vary depending upon the Bt time and the clock rate on the microprocessor 25.

Table 1 below represents some possible combinations of polling rates, Bt time, number of packets exchanged and the number of devices on a bus.

TABLE 1

| 1/Bt | Polling Rate per second | Packets per Exchange | Devices |
|------|-------------------------|----------------------|---------|
| 300  | 2                       | 6                    | 25      |
| 300  | 4                       | 6                    | 12      |
| 300  | 10                      | 3                    | 10      |
| 300  | 8                       | 4                    | 8       |
| 9600 | 100                     | 6                    | 16      |

1/Bt is defined by the following equation: 1/Bt = (polling times per second) * (Number of Devices) * (Packets per exchange + Reply wait packets) * (11 bits per packet)

The larger the Bt time, the less expensive the push-button microprocessor 25 and associated components. As noted above, if bit 8 is not set, the packet is a data packet. If bit 8 is set, the packet is an address/command packet. Table 2 below represents command packets for 8 devices. The device address is in bits 0–2 (address's 0–7). If bit 8 and bit 3 are set, this is a global packet destined for all push-buttons in the system. The global command is represented in bits 4–8. If additional data is required, the address packet may be extended to more than one packet.

TABLE 2

| Bit Position | | | | | | | | | Command |
|---|---|---|---|---|---|---|---|---|---|
| 8 | 7 | 6 | 5 | 4 | 3 | 2 | 1 | 0 | Command |
| 0 | x | x | x | x | x | X | x | x | Data, the ninth bit is 0 |
| 1 | 0 | 0 | 0 | 0 | 1 | X | x | x | Global command 0 |
| 1 | 0 | 0 | 0 | 1 | 1 | X | x | x | Global command 1 |
| 1 | 0 | 0 | 0 | 0 | 0 | 0 | 0 | 0 | Command 0 (bits 4–7) to device 0 |
| 1 | 0 | 0 | 0 | 1 | 0 | 1 | 1 | 0 | Command 1 to device 6 |
| 1 | 1 | 0 | 0 | 0 | 0 | 1 | 1 | 1 | Command 8 to device 7 |

Global commands will not elicit a response from a button. Direct commands to a specific button will always have a response to confirm that the button is active and functioning properly. The button will respond with one or more packets of data. Because the system will typically be a half duplex system, no two devices can send information at the same time. One device sends and the other receives. After the information is received, the other device may then send information in the form of a response.

The button can be illuminated to provide visual feedback to the operator that the button press has been recognized. When the button microprocessor 25 recognizes a button press it lights the visual feedback and reports the button press to the controller 45 at the next poll period. To overcome the possibility of noise causing an invalid button press signal, the button press is reported on the next poll as well. The controller 45 only recognizes a valid button press if it is sensed on two subsequent polls. The controller 45 sends a command to the push-button on the next poll to tell the button to maintain the illumination. If the controller 45 fails to tell the button to maintain the illumination, the button microprocessor 25 times out and turns off the illumination providing visual feedback to the operator that the controller 45 has not accepted the button press.

In some embodiments, it may be desirable to install a sound making device on the same bus as the push-buttons and controller. The sound making device may comprise a microprocessor, a sound chip (ISD 149PLG), a speaker, and/or indicating lights. The sound chip stores recorded sounds in an internal non-volatile memory. The microprocessor 25 communicates on the bus as in the same manner as the push-buttons and gets its unique address in the same manner as the push-buttons. The controller commands a specific Sound device at a specific address to play a specific sound. This sound may be a recording of a gong, which indicates an elevator has arrived or it may be a recorded voice saying "going down." The controller may command the device to play a recording saying "out of service" or "fire service" or any other appropriate message as conditions may warrant. The controller may also command the device to light or to extinguish indicating lamps as necessary. Up and down arrows can be illuminated as needed.

In addition, a position indicator can be connected to the bus using the same communication protocol as the push-buttons. The position indicator may comprise a microprocessor and an LCD display screen, or other display device. The position indicator, like the push-buttons, is assigned a unique address and communicates on the bus in the same manner as the push-buttons. The controller commands a specific display on the LCD display screen, such as for example, a floor number.

The push-button device may operate in several different modes. For example, the push-button button device may be configured as an edge detector, which detects the edges of the step function—i.e., when the push-button element is initially depressed or when it is released. The push-button device may also operate as a level detector, which detects the portion of the step function between the edges—i.e., when the push-button element is held in the depressed position. The detection mode of the button may be changed dynamically as the system is in operation. By adding this and other intelligence to the push-button device, the controller 45 may contain less resources or use its resources for other functions. In general, the more intelligent the push-button device, the less intelligent the controller needs to be. Thus, the use of push-button devices allows for more efficient and cheaper systems.

While the push-button device is well suited for use in elevator systems, it may be used in any system that employs push-button switches. It may readily be adapted for use in explosive environments. Since the push-button device contains no mechanical contacts, the electrical components may be located in an explosion-proof housing and the push-button element and magnet may be located outside the housing. For example, the electrical components can be located behind an aluminum plate, and the magnet and push-button element can be located in front of the plate.

Figure 5:
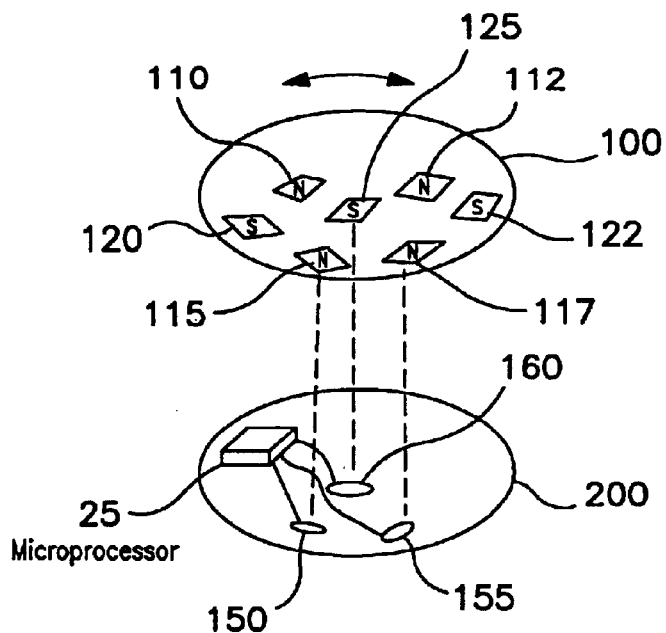
FIG. 5 illustrates a contactless rotary switching device.
Figure 6:
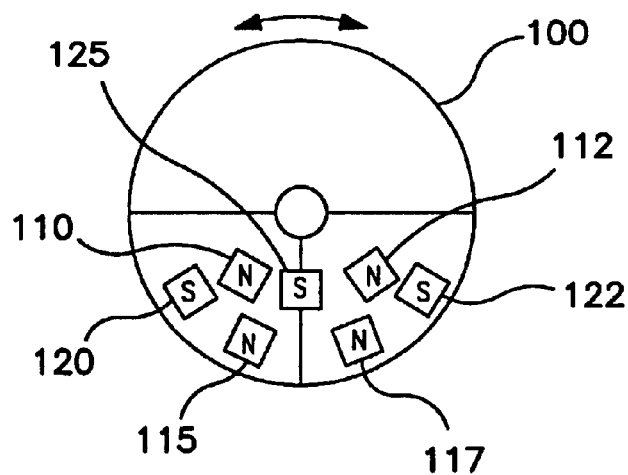
FIG. 6 is a top view of the rotary disk 100 shown in FIG. 5.

The contactless switching device of the present invention may take forms other than a push-button switch. As is shown in FIG. 5, a contactless switch may take the form of a lever operated rotary or key operated rotary switch, wherein the push-button element is replaced by a rotary, disk containing magnets. A rotary switch, unlike a single magnet/sensor combination switch, can be configured so that it cannot be fooled by an external magnetic field that is stronger than the magnet in the button. The rotary switch may use three Hall Effect transducers, 150, 155, and 160 that are connected to a microprocessor 25. These transducers are mounted on a planar surface 200. A first set of magnets, comprising magnets 115, 117, and 125, is mounted to a surface of a rotary disk 100 that is parallel to the planar surface 200. The Hall Effect transducers 150, 155, and 160 are located and aligned below magnets 115, 117, and 125, respectively, when the disk 100 is in a first position. The rotary disk 100 can rotate clockwise and counter clockwise. Additional magnets 110, 112, 120, and 122 are also mounted to the surface of the rotary disk 100. As shown in FIGS. 5 & 6, the arrangement of the magnetic polarities is such that in each of the three positions, the pattern of magnets detected by the three transducers is different and all three of the magnets do not have their polarities oriented in the same direction. When the disk 100 rotates, a second set of magnets aligns over the transducers 150, 155, and 160. For example, if the disk 100 rotates clockwise to a second position, magnet 122 aligns over transducer 155 and magnet 117 aligns over transducer 150 and magnet 112 aligns over transducer 160. Since the all the magnets in the second set do not all have the same polarity orientation as the magnets in the first set, the Hall effect voltages at at least one transducer changes and when the Hall Effect voltage values stabilize, the new position of the disk can be determined by the microprocessor 25. Moreover, since a rotary device may use a plurality of magnets having their polarities oriented in different directions, an external magnet cannot fool the switch because the external magnet would bias all sensors in the same manner.

While the rotating switch embodiment described herein uses three magnets, the number of magnets and their orientations may vary. The disk may be rotated, for example, by a key or a lever. The actual manner in which the disk is rotated is not critical. Nor is it critical that the sensors be located directly over the magnets since the microprocessor may be programmed to detect changes in the magnetic fields acting on the Hall Effect transducers.

It is also possible to configure a rotary device with one or more magnets disposed on a rotating disk and one or more Hall Effect transducers located on a planar surface that is parallel to the surface of the disk. As the disk rotates, the distance between the Hall Effect transducers and the magnets vary. This causes the Hall Effect voltage in the transducer to vary, and the change in Hall Effect voltages can be interpreted by a microprocessor as a rotation of the disk. In some embodiments, mere rotation of a magnet relative to a Hall Effect transducer may be sufficient to cause changes in the Hall Effect voltage at the transducer.

What is claimed is:

1. A contactless push-button device comprising:
   a push-button element that is linearly displaceable between a first position and a second position and biased to move from the second position to the first position;
   a magnet mounted to the push button element;
   a Hall Effect transducer mounted in line with the linear displacement direction of the push-button so that when the push-button moves from the first position to the second position the distance between the magnet and the Hall Effect transducer changes; and a programmable microprocessor for being assigned a unique address, the programmable microprocessor electrically connected to the Hall Effect transducer and programmed to execute a field averaging algorithm to compensate for changes in quiescent Hall Effect voltages.

2. The contactless push-button device of claim 1, further comprising a plate mounted between the push-button element and the Hall Effect Transducer.

3. The contactless push-button device of claim 1, further comprising a feedback device that is electrically connected to the microprocessor.

4. The contactless push-button device of claim 1, further comprising a system controller that is interfaced with the microprocessor, the controller assigning an address to the push-button device during a start-up procedure.

5. The contactless push-button device of claim 1, wherein the microprocessor is programmed to contain a unique address.

6. The contactless push-button device of claim 3 further comprising:

a serial bus connected to the microprocessor; and an elevator controller connected to the serial bus.

7. The contactless push-button switch of claim 6, wherein the serial bus is an RS 485 bus.

8. A contactless, rotary switch device comprising:

a rotating disk having a surface;

one or more magnets disposed on the disk;

one or more Hall Effect transducers located on a planar surface that is parallel to the surface of the disk, the distance between the Hail Effect transducers and the magnets varying as the disk rotates; and a programmable microprocessor that is electrically connected to the microprocessor and programmed to execute a field averaging algorithm to compensate for changes in quiescent Hall Effect voltages.

9. The device of claim 8, further comprising a system controller that is interfaced with the microprocessor, the controller for assigning an address to the rotary switch device during a start-up procedure.

10. The device of claim 8, wherein the microprocessor is programmed to contain a unique address.

11. The device of claim 8 further comprising:

a serial bus connected to the microprocessor; and an elevator controller connected to the serial bus.

* * * * *